(12) United States Patent
Liikanen et al.

(10) Patent No.: US 10,990,475 B2
(45) Date of Patent: Apr. 27, 2021

(54) READ LEVEL EDGE FIND OPERATIONS IN A MEMORY SUB-SYSTEM

(71) Applicant: Micron Technology, Inc., Boise, ID (US)

(72) Inventors: Bruce A. Liikanen, Berthoud, CO (US); Larry J. Koudele, Erie, CO (US)

(73) Assignee: MICRON TECHNOLOGY, INC., Boise, ID (US)

( * ) Notice: Subject to any disclaimer, the term of this patent is extended or adjusted under 35 U.S.C. 154(b) by 7 days.

(21) Appl. No.: 16/507,511

(22) Filed: Jul. 10, 2019

(65) Prior Publication Data

US 2021/0011802 A1   Jan. 14, 2021

(51) Int. Cl.
| | |
|---|---|
| *G06F 11/00* | (2006.01) |
| *G06F 11/10* | (2006.01) |
| *G11C 11/56* | (2006.01) |
| *G06F 11/30* | (2006.01) |
| *G06F 11/07* | (2006.01) |

(52) U.S. Cl.
CPC ........ *G06F 11/1068* (2013.01); *G06F 11/076* (2013.01); *G06F 11/3037* (2013.01); *G11C 11/5642* (2013.01)

(58) Field of Classification Search
None
See application file for complete search history.

(56) References Cited

U.S. PATENT DOCUMENTS

| | | | | |
|---|---|---|---|---|
| 10,140,040 | B1* | 11/2018 | Koudele | G11C 29/021 |
| 10,430,112 | B2* | 10/2019 | Darragh | G11C 29/50004 |
| 2013/0290612 | A1* | 10/2013 | Weathers | G11C 16/08 |
| | | | | 711/103 |
| 2014/0229131 | A1* | 8/2014 | Cohen | G11C 29/021 |
| | | | | 702/64 |
| 2015/0085573 | A1* | 3/2015 | Sharon | G11C 16/26 |
| | | | | 365/185.03 |
| 2016/0148702 | A1* | 5/2016 | Karakulak | G11C 16/26 |
| | | | | 365/185.12 |
| 2018/0341552 | A1* | 11/2018 | Liikanen | G06F 11/0793 |
| 2018/0341553 | A1* | 11/2018 | Koudele | G11C 11/5642 |

OTHER PUBLICATIONS

R. Motwani, "Estimation of Flash Memory Level Distributions Using Interpolation Techniques for Optimizing the Read Reference," 2015 IEEE Global Communications Conference (GLOBECOM), San Diego, CA, 2015, pp. 1-6, doi: 10.1109/GLOCOM.2015.7416949. (Year: 2015).*

* cited by examiner

*Primary Examiner* — Daniel F. McMahon
(74) *Attorney, Agent, or Firm* — Lowenstein Sandler LLP

(57) ABSTRACT

A processing device receives a request to locate a first distribution edge at a target bit error rate (BER) of a first programming distribution. The processing device measures a first BER sample of the first programing distribution using a first offset value that is offset from a first center value corresponding to a first read level threshold and a second BER sample using a second offset value that is offset from the first offset value. The processing device determines that the second BER sample exceeds the target BER and the first BER sample does not exceed the target BER. The processing device determines a first location of the first distribution edge by interpolating between the first BER sample and the second BER sample.

20 Claims, 7 Drawing Sheets

READ LEVEL EDGE FIND OPERATIONS IN A MEMORY SUB-SYSTEM

TECHNICAL FIELD

Embodiments of the disclosure relate generally to memory sub-systems, and more specifically, relate to read level edge find operations in a memory sub-system.

BACKGROUND

A memory sub-system can be a storage system, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
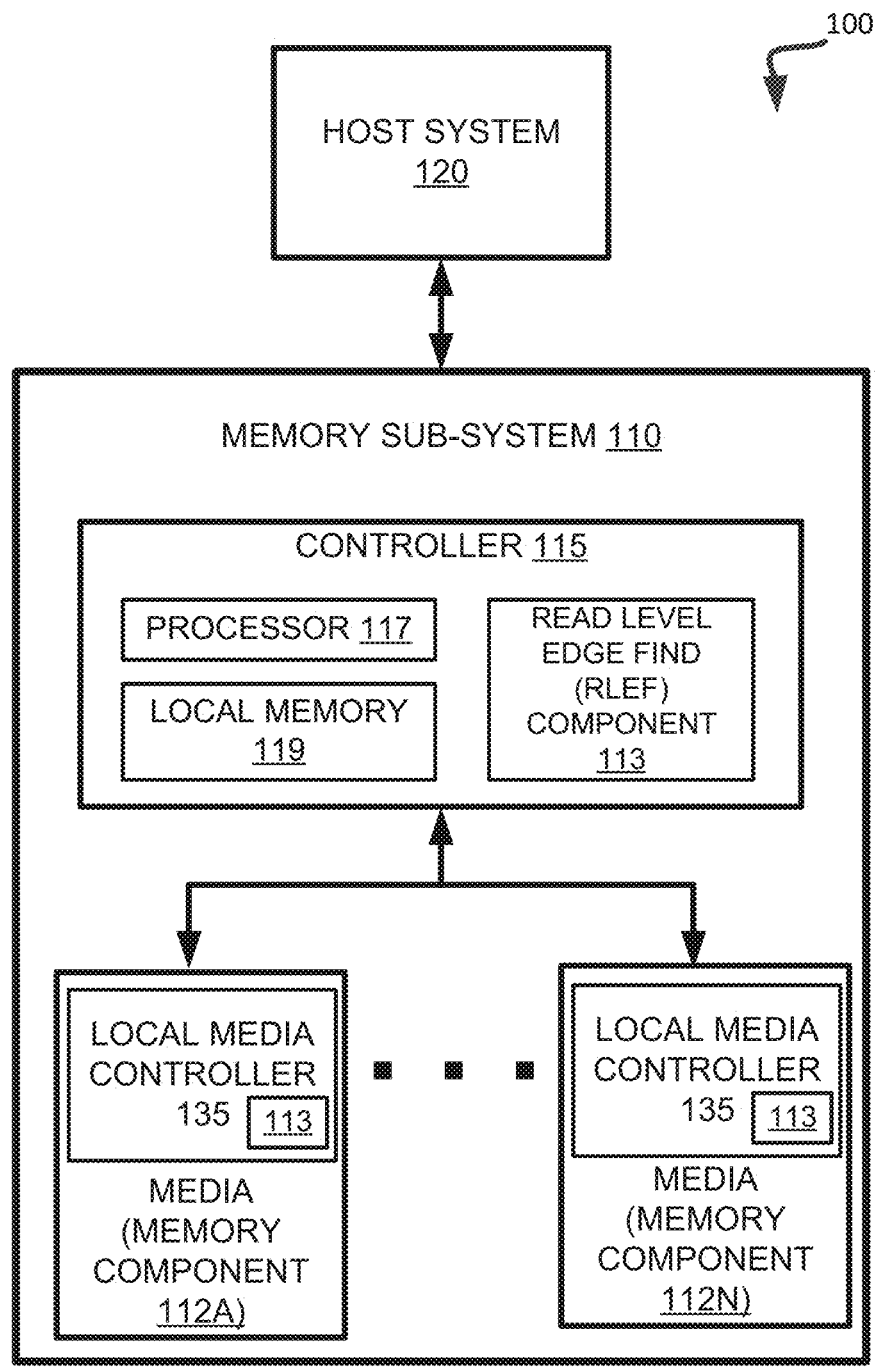
FIG. 1 illustrates an example computing environment that includes a memory sub-system in accordance with some embodiments of the present disclosure.

Aspects of the present disclosure are directed to read level edge find operations in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data to be stored at the memory sub-system and can request data to be retrieved from the memory sub-system.

The memory sub-system can include multiple memory devices that can store data from the host system. Conventional memory sub-systems use an Error Correction Code (ECC) decoder, to detect and correct a limited number of errors in data read from the memory devices. ECC decoders have a correction capability that indicates that the ECC decoder cannot correct more than a specified number of bit errors present in data read from the memory devices. Parity information can be used to correct errors, but the parity information limits the number of errors that can be corrected. Conventional memory sub-systems can attempt to characterize the programming distributions of the memory cells for failure analysis of the memory sub-system to manage the number of bit errors present in data read from the memory devices. To characterize the programming distributions, the distribution widths and valley margins are measured and a total distribution level width is a sum of all distribution widths of the multiple programming distributions and a read window budget (RWB) is a sum of all valley margins between the programming distributions. Conventionally, the RWB measurements are made in NAND component tests and the RWB measurements are made from conditional Vt. These RWB measurements are performed during testing using known program data measurements. In another conventional memory system, the memory sub-system can use the read samples to compute a difference error count (DiffEC). The difference error count can be used to determine a valley depth or a relative RWB, as described herein. Conventional memory sub-systems, however, do not have the capability to measure the equivalent RWB measurement in the memory sub-system itself (also referred to the system product). The system product's use cases and workloads and environment conditions affect RWB and conventional memory sub-system cannot measure this effect. Also, there can be defects in the system product that cause abnormal distributions that cannot be measured by conventional memory sub-systems.

Aspects of the present disclosure address the above and other deficiencies by enabling in situ measurement of RWB within a system product. The aspects of the present disclosure can accurately measure distribution widths and valley margins for failure analysis and characterization (e.g., NAND characterization). To measure accurate distribution edge voltages and compute distribution widths and valley margins between distributions, the memory sub-system can incrementally offset one read level threshold at a time until it crosses a target BER. The memory sub-system interpolates between BER of a previous sample and a current sample to compute a fractional increment location of the distribution edge at the target BER. For a given page type, a single read level threshold of that page type can be incremented and the BER of that page is read. The measured BER is compared to a user supplied, target BER. When the measured BER exceeds the target BER, the process is stopped and the fractional location between the current and last read level increment is computed to improve the accuracy of the target BER location.

The aspects of the present disclosure can be performed without need of known program data and can provide the ability to correlate NAND component measurements with system product measurements. The aspects of the present disclosure can measure the effect caused by the different use cases, workloads, and environment conditions that affect RWB and total distribution level. The aspects of the present disclosure can measure defectivity causing abnormal distribution. The aspects of the present disclosure can enable accurate edge detection and distribution offset changes due to temperature. For example, the accurate edge detection and distribution offset changes from the aspects of the present disclosure can be used in Dynamic Temperature Compensation (DTC) operations. The aspects of the present disclosure can also enable or improve Dynamic Program Step Level Width (DPSW) operations, Dynamic Program Step Read Window Budget (DPSRWB) operations, and the like. The aspects of the present disclosure can enable in situ measurements for total level width and RWB of memory cells that are influenced by program gate step, temperature, endurance, retention, program disturb, read disturb, charge gain, charge loss, defectivity, or the like.

Advantages of the present disclosure include, but are not limited to, an improved system in which in situ measurements of RWB and total distribution level are enabled within a system product, an improved system in which the distribution widths and valley margins are accurately measured for failure analysis and characterization of the memory cells, an improved system in which measurements for level width and RWB are enabled for memory cells that are influenced by various different conditions as described herein.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a negative-and (NAND) type flash memory. Each of the memory devices 130 can include one or more arrays of memory cells such as single level cells (SLCs) or multi-level cells (MLCs) (e.g., triple level cells (TLCs) or quad-level cells (QLCs)). In some embodiments, a particular memory component can include an SLC portion, and an MLC portion, a TLC portion, or a QLC portion of memory cells. Each of the memory cells can store one or more bits of data used by the host system 120. Furthermore, the memory cells of the memory devices 130 can be grouped as memory pages or memory blocks that can refer to a unit of the memory component used to store data.

Although non-volatile memory components such as NAND type flash memory are described, the memory device 130 can be based on any other type of non-volatile memory, such as read-only memory (ROM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

The memory sub-system 110 includes a read level edge find (RLEF) component 113 to measure accurate distribution edge voltages and compute distribution width and RWB between distributions. In some embodiments, the memory sub-system controller 115 includes at least a portion of the RLEF component 113. For example, the memory sub-system controller 115 can include a processor 117 (processing device) configured to execute instructions stored in local memory 119 for performing the operations described herein. Alternatively, the memory sub-system controller 115 includes circuits to implement the operations described herein. In some embodiments, the RLEF component 113 can be part of each the memory components 112A to 112N. In these embodiments, the RLEF component 113 of the memory component 112A can perform the operations described herein. Alternatively, the operations can be split between the memory sub-system controller 115 (e.g., SSD controller) of the memory sub-system 110 and the individual memory components 112A-112N of the memory sub-system 110.

As described herein, in some embodiments, the memory devices 130 include local media controllers 135 that operate in conjunction with memory sub-system controller 115 to execute operations on one or more memory cells of the memory devices 130. In some embodiments, the local media controllers 135 include the RLEF component 113. In these embodiments, the RLEF component 113 of the local memory controller 135 can perform the operations described herein. Alternatively, the operations can be split between the memory sub-system controller 115 and the local media controllers 135 of the individual memory devices 112A-112N of the memory sub-system 110. The memory sub-system controller 115 can include an ECC decoder.

During operation, the RLEF component 113 can receive a read level edge find request (a distribution edge find request or simply a request) to locate one or more distribution edges of one or more programming distributions of a memory cell in the memory components 112A to 112N. The request specifies a target BER for the one or more programming distributions. The target BER can be specified by a user. In response to the request, the RLEF component 113 can select a first programming distribution for which to locate a first distribution edge. The RLEF component 113 measures a first BER sample of the first programming distribution using a first offset value that is offset from a first center value corresponding to a first read level threshold. The RLEF component 113 can measure a second BER sample of the first programming distribution using a second offset value that is offset from the first offset value (or from the first center value). The second offset value is farther away from the first center value than the first offset value. The RLEF component 113 can determine that the second BER sample exceeds the target BER and the first BER sample does not exceed the target BER. The RLEF component 113 can determine a first location of the first distribution edge at the target BER by interpolating between the first BER sample and the second BER sample. It should be noted that the first BER sample and the second BER sample can be first and second BER samples obtained, but also can be any subsequent BER samples than the first and second BER samples obtained. That is the terms "first" and "second" are not used in the strict ordinal sense, but are merely indicative that the second BER sample is after the first BER sample and the second BER sample exceeds the target BER where the first BER sample does not exceed the target BER. The RLEF component 113 can determine other locations of other distribution edges at the target BER and can uses the locations of the distribution edges to determine one or more distribution widths, one or more margin widths, which can be used to measure a total distribution level and RWB for the memory cell.

In a further embodiment, the RLEF component 113, in response to the request, can measure a third BER sample of the first programming distribution using a third offset value that is offset from a second center offset value of a second read level threshold, the second read level threshold being on an opposite side of the first programming distribution. The RLEF component 113 can measure a fourth BER sample of the first programming distribution using a fourth offset value that is offset from the third offset value (or from the second center offset value). As above, the fourth offset value is farther away from the second center offset value than the third offset value. The RLEF component 113 can determine that the fourth BER sample exceeds the target BER and the third BER sample does not exceed the target BER. The RLEF component 113 can determine a second location of a second distribution edge of the first programming distribution at the target BER by interpolating between the third BER sample and the fourth BER sample. In a further embodiment, the RLEF component 113 can determine a distribution width of the first programming distribution using the first location of the first distribution edge and the second location of the second distribution edge.

In a further embodiment, the RLEF component 113 can determine a third location of a third distribution edge of a second programming distribution by interpolating between two BER samples where one of the two BER samples exceeds the target BER. The RLEF component 113 can determine a fourth location of a fourth distribution edge of the second programming distribution by interpolating between two BER samples where one of the two BER samples exceeds the target BER; The RLEF component 113 can determine a second distribution width of the second programming distribution using the third location of the third distribution edge and the fourth location of the fourth distribution edge. The RLEF component 113 can determine a total distribution level using the distribution width of the first programming distribution and the second distribution width of the second programming distribution.

In a further embodiment, the RLEF component 113, in response to the request, can select a second programming distribution for which to locate a third distribution edge, the second programming distribution being adjacent to the first programming distribution. The RLEF component 113 can measure a third BER sample of the second programming distribution using a third offset value that is offset from the first center offset value corresponding to the first read level threshold and a fourth BER sample of the second programming distribution using a fourth offset value that is offset from the third offset value (or from the first center offset value). The RLEF component 113 can determine that the fourth BER sample exceeds the target BER and the third BER sample does not exceed the target BER. The RLEF component 113 can determine a third location of the third distribution edge at the target BER by interpolating between the third BER sample and the fourth BER sample. The RLEF component 113 can determine a valley margin between the first programming distribution and the second programming distribution using the first location of the first distribution edge and the third location of the third distribution edge.

In another embodiment, the local media controller 135 receives a request from the memory sub-system controller 115 to calculate a RWB of a memory cell. The request specifies a target BER for the multiple programming distributions of the memory cell. In response to the request, the local media controller 135 determines a location for each distribution edge of each of the multiple programming distributions. To determine the location of a respective distribution edge, the local media controller 135 iteratively measures BER samples of a respective side of a respective programming distribution until a first BER sample exceeds the target BER and determines the location of the respective distribution edge by interpolating a fractional location between the first BER sample that exceeds the target BER and a second BER sample that does not exceed the target BER. The local media controller 135 measures a valley margin of a valley between each pair of the multiple programming distributions using the locations of respective distribution edges at a respective valley. The local media controller 135 calculates the RWB of the memory cell by summing the valley margins between the multiple programming distributions of the memory cell. The local media controller 135 sends the RWB to the memory sub-system controller 115.

In another embodiment, the local media controller 135 receives a request from the memory sub-system controller 115 to calculate a total distribution level width of the memory cell. The request specifies the target BER. The local media controller 135 measures a distribution width of each of the multiple programming distributions using the locations of respective distribution edges of a respective programming distribution. The local media controller 135 calculates the total distribution level width of the memory cell by summing the distribution widths of the multiple programming distributions. The local media controller 135 sends the total distribution level width to the memory sub-system controller 115.

In other embodiments, the local media controller 135 can receive individual requests from the memory sub-system controller 115 to locate each distribution edge individually. The memory sub-system controller 115 can use the locations of the distribution edges to determine distribution widths, valley margins, the total distribution level width, the RWB, or any combination thereof.

In some embodiments, the host system 120 can include a portion of the RLEF component 113, such as described herein, where some of the operations of the RLEF component 113, as described herein, can be performed at the host system 120. That is, in another embodiment, the memory sub-system controller 115 receives a request from the host system 120 to calculate a RWB of a memory cell. The request specifies a target BER for the multiple programming distributions of the memory cell. In response to the request, the memory sub-system controller 115 determines a location for each distribution edge of each of the multiple programming distributions. To determine the location of a respective distribution edge, the memory sub-system controller 115 iteratively measures BER samples of a respective side of a respective programming distribution until a first BER sample exceeds the target BER and determines the location of the respective distribution edge by interpolating a fractional location between the first BER sample that exceeds the target BER and a second BER sample that does not exceed the target BER. The memory sub-system controller 115 measures a valley margin of a valley between each pair of the multiple programming distributions using the locations of respective distribution edges at a respective valley. The memory sub-system controller 115 calculates the RWB of the memory cell by summing the valley margins between the multiple programming distributions of the memory cell. The memory sub-system controller 115 sends the RWB to the memory sub-system controller 115. In another embodiment, the memory sub-system controller 115 receives a request from the host system to calculate a total distribution level width of the memory cell. The request specifies the target BER. The memory sub-system controller 115 measures a distribution width of each of the multiple programming distributions using the locations of respective distribution edges of a respective programming distribution. The memory sub-system controller 115 calculates the total distribution level width of the memory cell by summing the distribution widths of the multiple programming distributions. The memory sub-system controller 115 sends the total distribution level width to the host system 120. In other embodiments, the memory sub-system controller 115 can receive individual requests from the host system 120 to locate each distribution edge individually. The host system 120 can use the locations of the distribution edges to determine distribution widths, valley margins, the total distribution level width, the RWB, or any combination thereof. In other embodiments, the operations described herein are split between the host system 120, the memory sub-system controller 115, and the local media controller 135.

Figure 2:
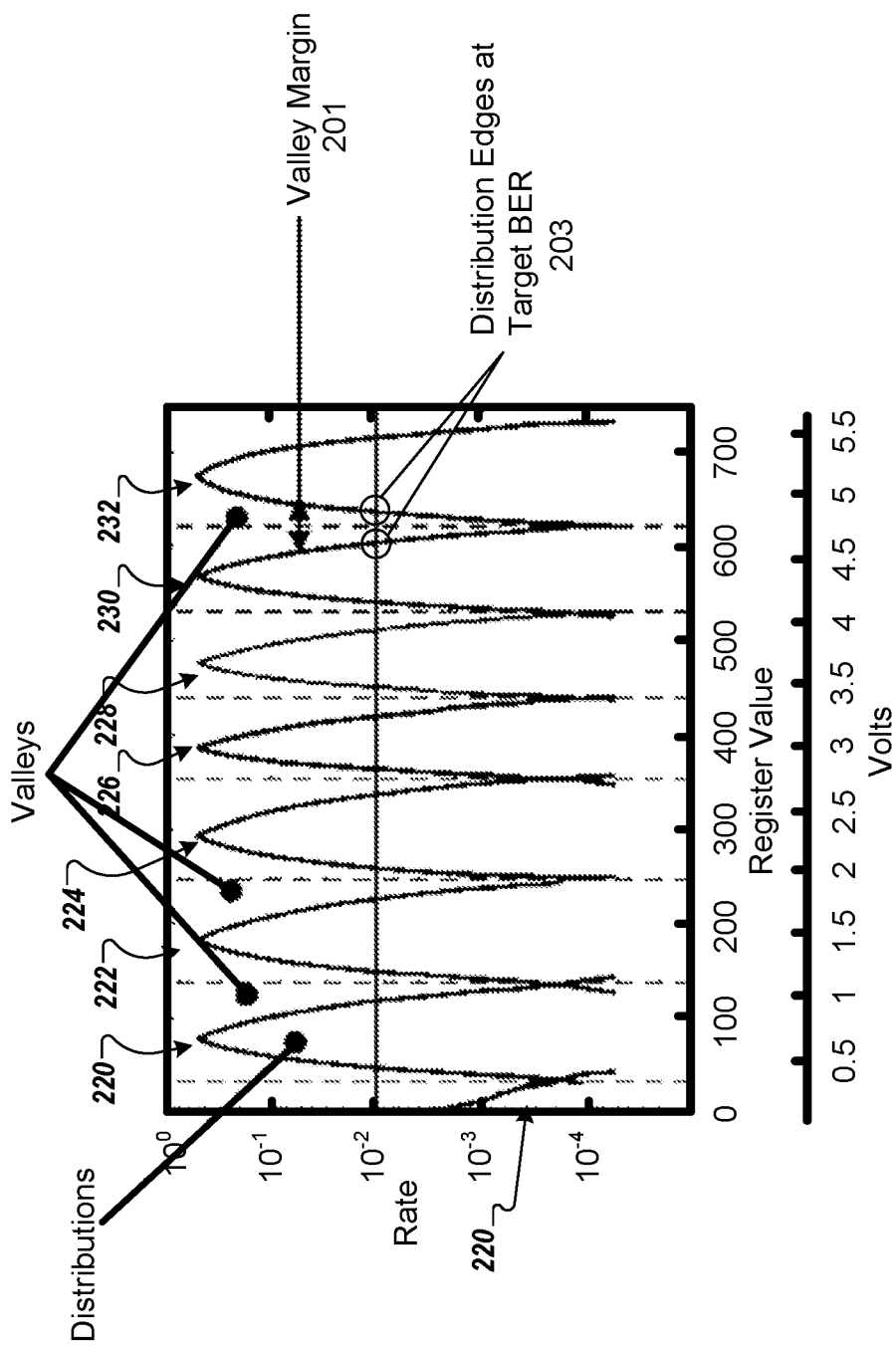
FIG. 2 illustrates distribution edges of multiple programming distributions at a target bit error rate (BER), in accordance with some embodiments of the present disclosure.

FIG. 2 illustrates distribution edges of multiple programming distributions at a target bit error rate (BER), in accordance with some embodiments of the present disclosure. A memory block with multi-level memory cells (e.g., TLC) stores TLC information using multiple bits of data per cell. As illustrated in FIG. 2, this is accomplished using multiple programming distributions 220-232. Between each of the programming distributions 220-232, is a valley having a valley margin 201 is measured between two distributions. As described herein, the RLEF component 113 can determine locations of the distribution edges 203 at a target BER. For example, the target BER can be set at an error rate of $10^{-2}$ and the RLEF component 113 can determine the locations of the distribution edges 203 at the specified error rate. The RLEF component 113 can determine the valley margin 201 using the locations of the distribution edges 203. The RLEF component 113 can measure all of the valley margins to determine a RWB for the memory cell. The RLEF component 113 can also measure a distribution width between two distribution edges of the same programming distribution. The RLEF component 113 can measure all of the distribution widths of the programming distributions 220-232 to determine a total distribution level of the memory cell. The RLEF component 113 can determine the distribution edges 203 by incrementally offsetting one read level threshold at a time until the BER samples exceed the target BER as illustrated and described below with respect to FIG. 3.

Figure 3:
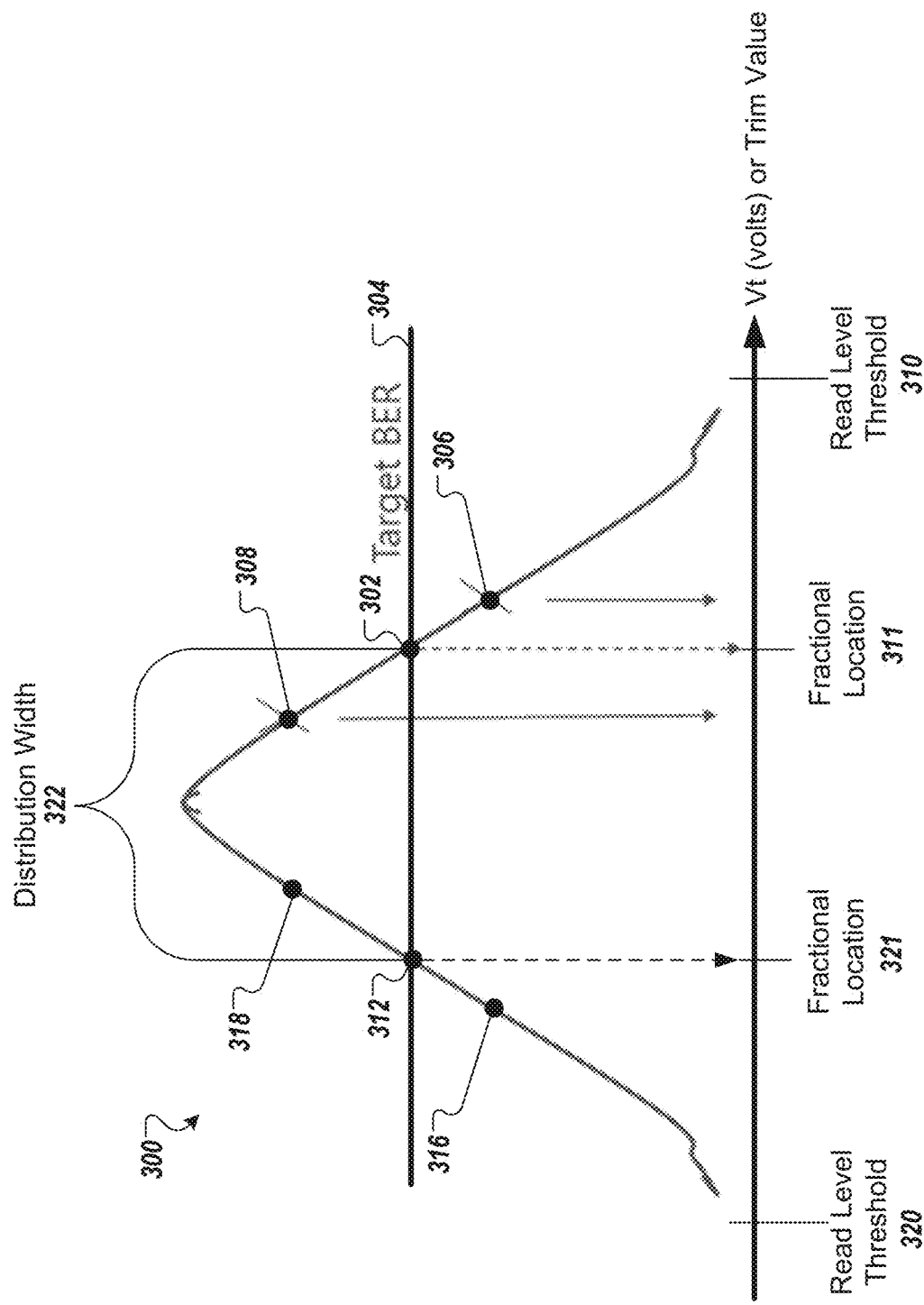
FIG. 3 illustrates locating a distribution edge of a programming distribution at a target BER by interpolating between a first BER sample and a second BER sample, in accordance with some embodiments of the present disclosure.

FIG. 3 illustrates locating a distribution edge 302 of a programming distribution 300 at a target BER 304 by interpolating between a first BER sample 306 and a second BER sample 308, in accordance with some embodiments of the present disclosure. The RLEF component 113 can receive a request to locate the distribution edge 302 of the programming distribution 300. In response to the request, the RLEF component 113 measures BER samples of the programming distribution 300. The RLEF component 113 can start with any offset value that is offset in a first direction from a read level threshold 310. The read level threshold 310 can be considered to be at a center offset value for the respective valley. The RLEF component 113 reads a BER sample at the offset value and compares the BER sample against the target BER 304. If the BER sample does not meet or exceed the target BER 304, the RLEF component 113 increments the offset value further in the first direction and reads another BER sample at a further offset value and compares the other BER sample against the target BER 304. The RLEF component 113 continues incrementing the offset value until a BER sample exceeds the target BER 304, as illustrated as the second BER sample 308. The RLEF component 113 uses the BER sample that exceeds the target BER 304 and the last BER sample that did not exceed the target BER 304, as illustrated as the first BER sample 306, to determine the location of the first distribution edge 302. The RLEF component 113 determines a first location of the distribution edge 302 by interpolating the first BER sample 306 (i.e., the last BER sample that did not exceed the target BER 304) and the second BER sample 308 (i.e., the first BER sample that does exceed the target BER 304). By interpolating between the first BER sample 306 and the second BER sample 308, the RLEF component 113 can compute a fractional location 311 of the distribution edge 302 at the target BER 304. The fractional location 311 can be the X-axis location of the distribution edge 302 at the target BER 304 for the programming distribution 300. The fractional location 311 can be expressed as a fractional increment location with respect to the first BER sample 306 and the second BER sample 308. In other embodiments, the fractional location 311 can be expressed in terms of an offset value from the read level threshold 310 or with reference to another reference point. As described herein, the fractional location 311 between the current and last read level increment is computed to improve the accuracy of the location of the distribution edge 302 at the target BER 304. With the fractional location 311, the Vt voltage (also referred to as the total trim value) can be computed by adding a base value for a trim value of read level threshold 310 (e.g., a center value of the read level threshold 310) to the trim offset value, reflected by the fractional location 311 of the interpolated location of the distribution edge 302 at the target BER 304, and multiplying this value by a voltage resolution (e.g., mV/step) to obtain the first location of the distribution edge 302.

In a further embodiment, the RLEF component 113 can locate a second distribution edge 312 of the same programming distribution 300 in response to the same request or in response to a separate request. To locate the second distribution edge 312, the RLEF component 113 can start with any offset value that is offset in a second direction from a second read level threshold 320. The read level threshold 320 can be considered to be at a center offset value for a respective valley. The RLEF component 113 reads a BER sample at the offset value and compares the BER sample against the target BER 304. If the BER sample does not meet or exceed the target BER 304, the RLEF component 113 increments the offset value further in the second direction and reads another BER sample at a further offset value and compares the other BER sample against the target BER 304. The RLEF component 113 continues incrementing the offset value in the second direction until a BER sample exceeds the target BER 304, as illustrated as a fourth BER sample 318. The RLEF component 113 takes the last BER sample that did not exceed the target BER 304, as illustrated as a third BER sample 316. The RLEF component 113 determines a second location of the second distribution edge 312 by interpolating the third BER sample 316 (i.e., the last BER sample that did not exceed the target BER 304 in the second direction) and the fourth BER sample 318 (i.e., the first BER sample that does exceed the target BER 304 in the second direction). By interpolating between the third BER sample 316 and the fourth BER sample 318, the RLEF component 113 can compute a second fractional location 321 of the second distribution edge 312 at the target BER 304. The second fractional location 321 can be the X-axis location of the second distribution edge 312 at the target BER 304 for the programming distribution 300. The fractional location 321 can be expressed as a fractional increment location with respect to the third BER sample 316 and the fourth BER sample 318. In other embodiments, the fractional location 321 can be expressed in terms of an offset value from the second read level threshold 320 or with reference to another reference point. As described herein, the fractional location 321 between the current and last read level increment is computed to improve the accuracy of the location of the second distribution edge 312 at the target BER 304. With the fractional location 321, the Vt voltage (also referred to as the total trim value) can be computed by adding a second base value for a second trim value of second read level threshold 320 (e.g., a center value of the second read level threshold 320) to the trim offset value, reflected by the fractional location 321 of the interpolated location of the second distribution edge 312 at the target BER 304, and multiplying this value by the voltage resolution (e.g., mV/step) to obtain the second location of second first distribution edge 312.

In a further embodiment, the RLEF component 113 can calculate a distribution width 322 of the programming distribution 300 in response to the same request or in response to a separate request. For example, the RLEF component 113 can receive a request to locate the distribution width 322 or a request to locate a total distribution level width of all programming distributions. The RLEF component 113 can determine the distribution width 322 using the first location of the distribution edge 302 and the second location of the second distribution edge 312. For example, the RLEF component 113 can calculate a difference between the fractional location 311 and the second fractional location 321. As illustrated in FIG. 3, the first location of the distribution edge 302 is a right side edge of the programming distribution 300 and the second location of the distribution edge 312 is a left side edge of the programming distribution 300. In other embodiments, the left side edge can be determined before the right side edge. Also, as illustrated in FIG. 3, the distribution width 322 is computed as the difference between the right and left side edges. Similarly, the RLEF component 113 can compute the distribution widths between the right and left side edges of each programming distributions. A total distribution level width can be calculated by the RLEF component 113 as the sum of all distribution widths. The distribution edges can also be located to determine valley margins and a RWB, as illustrated and described below with respect to FIG. 4.

Figure 4:
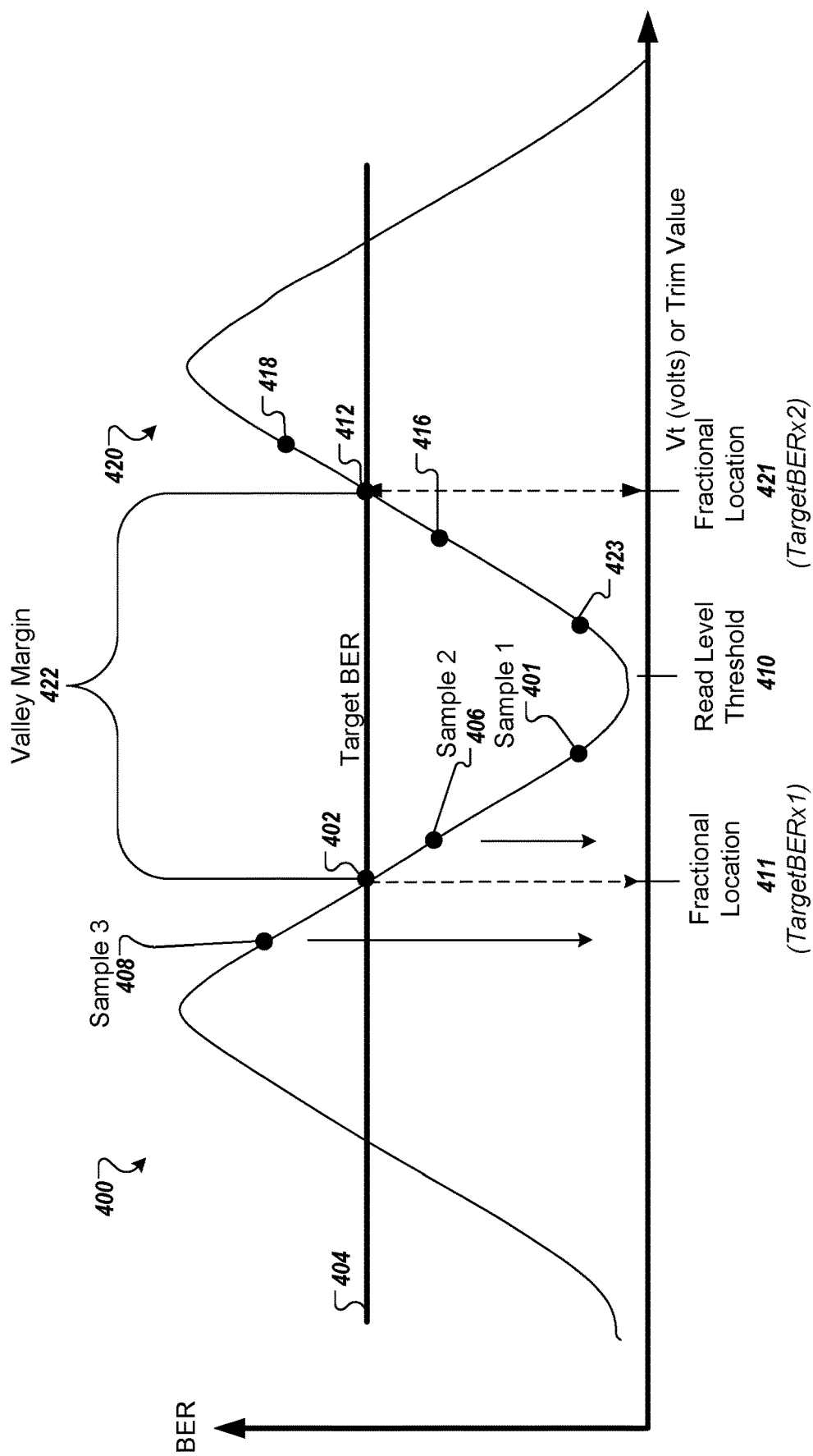
FIG. 4 illustrates locating a first distribution edge of a first programming distribution at a target BER and a second distribution edge of a second programming distribution for determining a valley margin, in accordance with some embodiments of the present disclosure.

FIG. 4 illustrates locating a first distribution edge 402 of a first programming distribution 400 at a target BER 404 and a second distribution edge 412 of a second programming distribution 420 for determining a valley margin 422, in accordance with some embodiments of the present disclosure. To locate the first distribution edge 402, such as in response to a request to locate the first distribution edge 402 or a request to determine the valley margin 422, the RLEF component 113 measures BER samples of the programming distribution 400, such as the right side of the programming distribution 400. The RLEF component 113 can start with any offset value that is offset in a first direction from a read level threshold 410, such as illustrated by a first BER sample 401. The read level threshold 410 can be considered to be at a center offset value for the respective valley. The RLEF component 113 reads the first BER sample 401 at a first offset value and compares the first BER sample 401 against the target BER 404. Since the first BER sample 401 does not meet or exceed the target BER 404, the RLEF component 113 increments the first offset value to a second offset value in the first direction and reads a second BER sample 406 at the second offset value and compares the second BER sample 406 against the target BER 304. Since the second BER sample 406 does not meet or exceed the target BER 404, the RLEF component 113 increments the second offset value further in the first direction to a third offset value and reads a third BER sample 408 at the third offset value and compares the third BER sample 408 against the target BER 404. Since the third BER sample 408 does exceed the target BER 304, the RLEF component 113 stops the process of incremental reads of the BER samples and uses the third BER sample 408 and last BER sample that did not exceed the target BER 304, as illustrated as the second BER sample 406, to determine the first location of the first distribution edge 402. The RLEF component 113 determines a first location of the distribution edge 402 by interpolating the second BER sample 406 (i.e., the last BER sample that did not exceed the target BER 404) and the third BER sample 408 (i.e., the first BER sample that does exceed the target BER 404). By interpolating between the second BER sample 406 and the third BER sample 408, the RLEF component 113 can compute a first fractional location 411 of the first distribution edge 402 at the target BER 404. The fractional location 311 can be the X-axis location of the first distribution edge 402 at the target BER 404 for the first programming distribution 400. The first fractional location 411 can be expressed as a fractional increment location with respect to the second BER sample 406 and the third BER sample 408. In other embodiments, the first fractional location 411 can be expressed in terms of an offset value from the read level threshold 410 or with reference to another reference point. As described herein, the first fractional location 411 between the current and last read level increment is computed to improve the accuracy of the location of the first distribution edge 402 at the target BER 404. With the first fractional location 411, the Vt voltage (also referred to as the total trim value) can be computed by adding a base value for a trim value of read level threshold 410 (e.g., a center value of the read level threshold 410) to the trim offset value, reflected by the first fractional location 411 of the interpolated location of the first distribution edge 402 at the target BER 404, and multiplying this value by a voltage resolution (e.g., mV/step) to obtain the first location of the first distribution edge 402.

In a further embodiment, the RLEF component 113 can locate a second distribution edge 412 of a second programming distribution 420 in response to the same request or in response to a separate request. To locate the second distribution edge 412, the RLEF component 113 can start with any offset value that is offset in a second direction from the read level threshold 410. The RLEF component 113 reads a first BER sample 423 at a first offset value and compares the first BER sample 423 against the target BER 404. Since the first BER sample 423 does not meet or exceed the target BER 404, the RLEF component 113 increments the first offset value further in the second direction to a second offset value and reads a second BER sample 416 at the second offset value and compares the second BER sample 416 against the target BER 404. Since the second BER sample 416 does not meet or exceed the target BER 404, the RLEF component 113 increments the second offset value further in the second direction to a third offset value and reads a third BER sample 418 at the third offset value and compares the third BER sample 418 against the target BER 404. Since the third BER sample 418 does exceed the target BER 404, the RLEF component 113 stops the process of incremental reads of the BER samples and uses the third BER sample 418 and last BER sample that did not exceed the target BER 404, as illustrated as the second BER sample 416, to determine the second location of the second distribution edge 412. The RLEF component 113 determines a second location of the second distribution edge 412 by interpolating the second BER sample 416 (i.e., the last BER sample that did not exceed the target BER 404) and the third BER sample 418 (i.e., the first BER sample that does exceed the target BER 404). By interpolating between the second BER sample 416 and the third BER sample 418, the RLEF component 113 can compute a second fractional location 421 of the second distribution edge 412 at the target BER 404. The second fractional location 421 can be the X-axis location of the second distribution edge 412 at the target BER 404 for the second programming distribution 420.

The second fractional location 421 can be expressed as a fractional increment location with respect to the second BER sample 416 and the third BER sample 418. In other embodiments, the second fractional location 421 can be expressed in terms of an offset value from the read level threshold 410 or with reference to another reference point. As described herein, the fractional location 421 between the current and last read level increment is computed to improve the accuracy of the location of the second distribution edge 412 at the target BER 404. With the second fractional location 421, the Vt voltage (also referred to as the total trim value) can be computed by adding a base value for a trim value of read level threshold 410 (e.g., a center value of the read level threshold 410) to the trim offset value, reflected by the second fractional location 421 of the interpolated location of the second distribution edge 412 at the target BER 404, and multiplying this value by a voltage resolution (e.g., mV/step) to obtain the second location of the second distribution edge 412.

In a further embodiment, the RLEF component 113 can calculate a valley margin 422 between the two programming distributions 400, 420 in response to the same request or in response to a separate request. For example, the RLEF component 113 can receive a request to locate the valley margin 422 or a request to locate a RWB of all of the programming distributions. The RLEF component 113 can determine the valley margin 422 using the first location of the first distribution edge 402 and the second location of the second distribution edge 412. For example, the RLEF component 113 can calculate a difference between the first fractional location 411 and the second fractional location 421. As illustrated in FIG. 4, the first location of the first distribution edge 402 is a right side edge of the first programming distribution 400 and the second location of the distribution edge 412 is a left side edge of the second programming distribution 420. In other embodiments, the left side edge can be determined before the right side edge. Also, as illustrated in FIG. 4, the valley margin 422 is computed as the difference between the right and left side edges. Similarly, the RLEF component 113 can compute the valley margins between the right and left side edges of each programming distributions. The RWB can be calculated by the RLEF component 113 as the sum of all valley margins. The distribution edges can also be located for any given programming distributions using a mask set for the particular read level threshold, as illustrated and described below with respect to FIG. 5.

Figure 5:
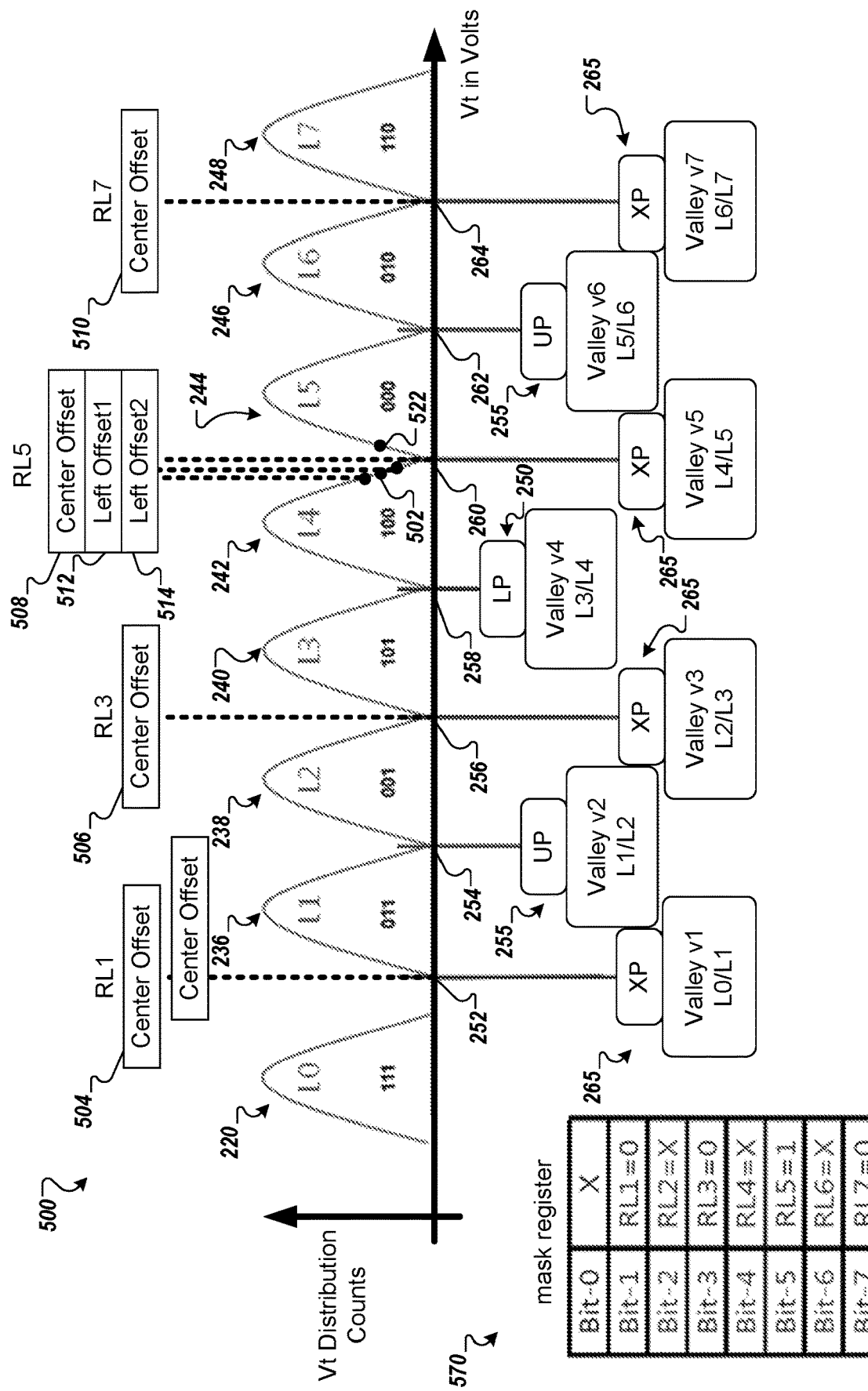
FIG. 5 illustrates a read level edge find operation with a mask set for a read level threshold between two programming distributions of a TLC memory cell with eight programming distributions, in accordance with some embodiments of the present disclosure.

FIG. 5 illustrates a read level edge find operation with a mask set for a read level threshold between two programming distributions of a TLC memory cell 500 with eight programming distributions, in accordance with some embodiments of the present disclosure. A memory block with TLC memory cells stores TLC information using 3 bits of data per cell. As illustrated in FIG. 5, this is accomplished using eight programming distributions 220 and 236-248. A lower page (LP) 250 is defined with one read level threshold 258. An upper page (UP) 255 is defined with two read level thresholds 254, 262. An extra page (XP) 265 is defined with fourth read level thresholds 252, 256, 260, and 264. The eight programming distributions 220 and 236-248 each correspond to a level (L1:L7), each level corresponding to a code (000b:111b). Between each pair of eight programming distributions is a valley, totally seven valleys (v1:v7). A center of each programming distribution 220 and 236-248 corresponds to a PV target for the respective programming distribution 220 and 236-248. In total, there can be seven PV targets and 7 read level thresholds 252-264.

A mask register 570 can be eight bits, where Bits 1-7 corresponding to the read level thresholds RL1-RL7, respectively. As illustrated in FIG. 5, the mask register 570 stores Os for Bit-1, Bit-3, and Bit-7, which correspond to the first read level threshold RL1 252, the third read level threshold RL3 256, and seventh read level threshold RL7 264 for an extra page (XP) type 265. The mask register 570 stores Xs for Bit-2, Bit-4, and Bit-6 corresponding to the non-strobed read level thresholds for the XP page type. The mask register 570 stores a 1 for Bit-5 corresponding to the fifth read level threshold RL5 260 to locate a first read level edge 502 for valley 5 on the extra page 265. In essence, the mask register bits mask RL1, RL3, and RL7 and disabled for RL5. The read level edge find operation for the XP 265 will provide the strobe results with BER samples limited to one side of the RL5 contribution. In one implementation, one read command, e.g., ONFi read command, can return one or more multiple BER samples. In this example, it should be noted that there are 4 strobes for each of the 3 reads in the RSO sample. In the first read operation, all strobes are at the center offset. In the second read operation, RL1, RL3, and RL7 are at the center offset and RL5 is at the lower threshold. In the third read operation, RL1, RL3, and RL7 are at the center offset and RL5 is at the higher threshold. Alternatively, as illustrated in FIG. 2, a first read operation can use a center offset value 508 to obtain a center offset sample 508, a second read operation can use a first left offset value 512, and a third read operation can use a second left offset value 514.

After the center offset sample 508, the first left offset sample 512, and the second left offset sample 514 are obtained, the RLEF component 113 can compare the first left offset sample 512 and the second left offset sample 514 against a target BER, such as specified by a host system, a user, or the like. The RLEF component 113 can determine that the second left offset sample exceeds the target BER and the first left offset sample 512 does not exceed the target BER. The RLEF component 113 determines a location of the first read level edge 502 for valley 5 on the extra page 265 by interpolating the first left offset sample 512 and the second left offset sample 514, as described herein.

In a further embodiment, the RLEF component 113 can also calculate a second location of a second read level edge 522 for valley 5 on the extra page 265 in a similar manner. Using the first read level edge 502 and the second read level edge 522, the RLEF component 113 can calculate a valley margin for valley 5.

Figure 6:
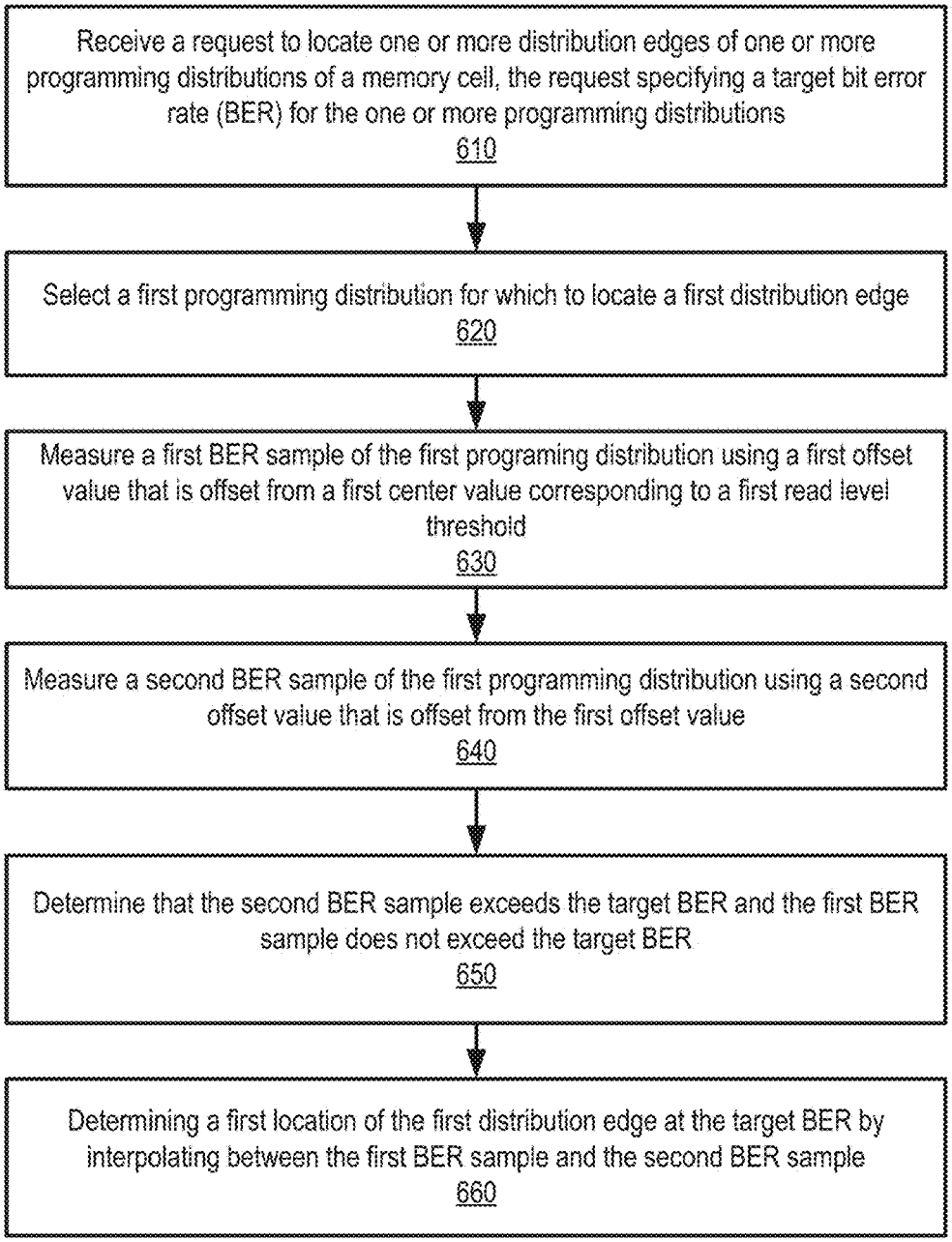
FIG. 6 is a flow diagram of an example method to perform a read level edge find operation in accordance with some embodiments of the present disclosure.

FIG. 6 is a flow diagram of an example method 600 to perform a read level edge find operation in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the RLEF component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the processing logic receives a request to locate one or more distribution edges of one or more programming distributions of a memory cell, the request specifying a target bit error rate (BER) for the one or more programming distributions. At operation 620, the processing logic selects a first programming distribution for which to locate a first distribution edge. At operation 630, the processing logic measures a first BER sample of the first programming distribution using a first offset value that is offset from a first center value corresponding to a first read level threshold. At operation 640, the processing logic measures a second BER sample of the first programming distribution using a second offset value that is offset from the first offset value. At operation 650, the processing logic determines that the second BER sample exceeds the target BER and the first BER sample does not exceed the target BER. At operation 660, the processing logic determines a first location of the first distribution edge at the target BER by interpolating between the first BER sample and the second BER sample, and the method 600 ends.

In a further embodiment, the processing logic sends a response to the request that includes the first location of the first distribution edge at the target BER. In another embodiment, the processing logic measures a third BER sample of the first programming distribution using a third offset value that is offset from a second center offset value of a second read level threshold, the second read level threshold being on an opposite side of the first programming distribution. The processing logic measures a fourth BER sample of the first programming distribution using a fourth offset value that is offset from the third offset value. The processing logic determines that the fourth BER sample exceeds the target BER and the third BER sample does not exceed the target BER. The processing logic determines a second location of a second distribution edge of the first programming distribution at the target BER by interpolating between the third BER sample and the fourth BER sample. The processing logic determines a distribution width of the first programming distribution using the first location of the first distribution edge and the second location of the second distribution edge.

In another embodiment, the processing logic determines a third location of a third distribution edge of a second programming distribution by interpolating between two BER samples where one of the two BER samples exceeds the target BER and a fourth location of a fourth distribution edge of the second programming distribution by interpolating between two BER samples where one of the two BER samples exceeds the target BER. The processing logic determines a second distribution width of the second programming distribution using the third location of the third distribution edge and the fourth location of the fourth distribution edge. The processing logic determines a total distribution level width using the distribution width of the first programming distribution and the second distribution width of the second programming distribution.

In another embodiment, the processing logic selects a second programming distribution for which to locate a third distribution edge, the second programming distribution being adjacent to the first programming distribution. The processing logic measures a third BER sample of the second programming distribution using a third offset value that is offset from the first center offset value corresponding to the first read level threshold and a fourth BER sample of the second programming distribution using a fourth offset value that is offset from the third offset value. The processing logic determines that the fourth BER sample exceeds the target BER and the third BER sample does not exceed the target BER. The processing logic determines a third location of the third distribution edge at the target BER by interpolating between the third BER sample and the fourth BER sample. The processing logic determines a first valley margin between the first programming distribution and the second programming distribution using the first location of the first distribution edge and the third location of the third distribution edge.

In another embodiment, the processing logic determines a fourth location of a fourth distribution edge of the second programming distribution by interpolating between two BER samples where one of the two BER samples exceeds the target BER. The processing logic determines a fifth location of a fifth distribution edge of a third programming distribution by interpolating between two BER samples where one of the two BER samples exceeds the target BER, the third programming distribution being adjacent to the second programming distribution. The processing logic determines a second valley margin between the second programming distribution and the third programming distribution using the fourth location of the fourth distribution edge and the fifth location of the fifth distribution edge. The processing logic determines a RWB using the first valley margin and the second valley margin.

In a further embodiment, to determine the first location of the distribution edge, the processing logic calculates a first fractional location by dividing a first difference between the target BER and the first BER sample by a second difference between the second BER sample and the target BER. Determining the first fractional location between the first BER sample and the second BER sample improves an accuracy of the first fractional location of the first distribution edge at the target BER. The processing logic adds the first fractional location to the first BER sample to obtain a first value and adds the first value to the first center value to obtain a second value. The processing logic multiples the second value by a voltage resolution to obtain the first location of the first distribution edge.

In another embodiment, the processing logic measures a third BER sample of the first programming distribution using a third offset value that is offset from the first center value prior to the measuring the first BER sample, compares the third BER sample against the target BER, and increments the third offset value to the first offset value or to an intervening offset value between the first offset value and the third offset value.

In another embodiment, to measure the first BER sample, the processing logic reads the first BER sample for a specified page of a specified page type. To determine that the second BER sample exceeds the target BER and the first BER sample does not exceed the target BER, the processing logic compares the first BER sample against the target BER, increments the first offset value to the second offset value in response to the first BER not exceeding the target BER, and compares the second BER sample against the target BER.

Figure 7:
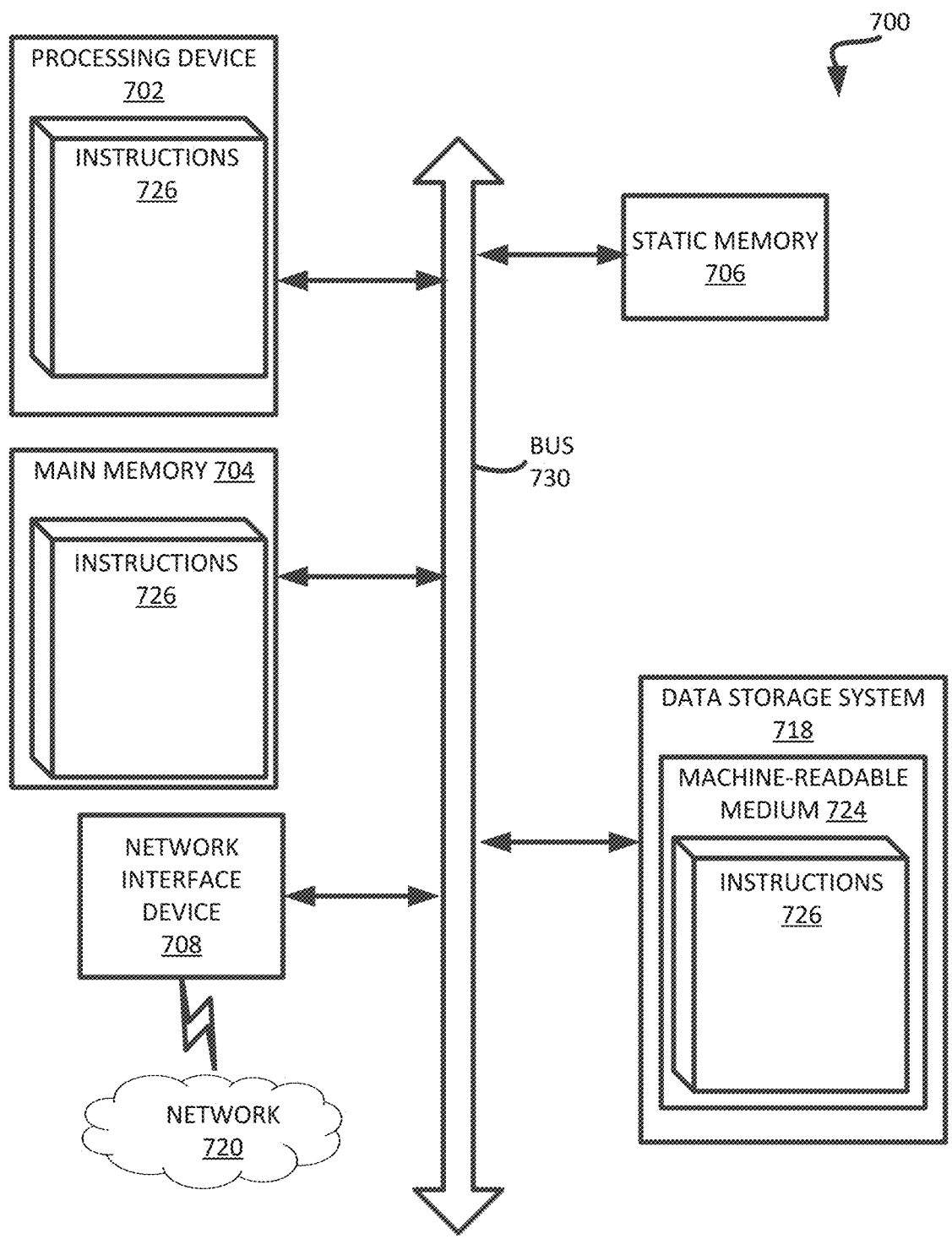
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the RLEF component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a caching component (e.g., the RLEF component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory system comprising:
one or more memory devices; and
a processing device coupled to the one or more memory devices, wherein the processing device is to receive a request to locate one or more distribution edges of one or more programming distributions of a memory cell, the request specifying a target bit error rate (BER) for the one or more programming distributions, wherein the processing device, in response to the request, is to:
select a first programming distribution for which to locate a first distribution edge;
measure a first BER sample of the first programing distribution using a first offset value that is offset from a first center value corresponding to a first read level threshold;
measure a second BER sample of the first programming distribution using a second offset value that is offset from the first offset value;
determine that the second BER sample exceeds the target BER and the first BER sample does not exceed the target BER; and
determine a first location of the first distribution edge at the target BER by interpolating between the first BER sample and the second BER sample.

2. The memory system of claim 1, wherein the processing device, in response to the request, is further to:
measure a third BER sample of the first programing distribution using a third offset value that is offset from a second center offset value of a second read level threshold, the second read level threshold being on an opposite side of the first programming distribution;
measure a fourth BER sample of the first programming distribution using a fourth offset value that is offset from the third offset value;
determine that the fourth BER sample exceeds the target BER and the third BER sample does not exceed the target BER; and
determine a second location of a second distribution edge of the first programming distribution at the target BER by interpolating between the third BER sample and the fourth BER sample.

3. The memory system of claim 2, wherein the processing device is to determine a distribution width of the first programming distribution using the first location of the first distribution edge and the second location of the second distribution edge.

4. The memory system of claim 3, wherein the processing device is further to:
determine a third location of a third distribution edge of a second programming distribution by interpolating between two BER samples where one of the two BER samples exceeds the target BER;
determine a fourth location of a fourth distribution edge of the second programming distribution by interpolating between two BER samples where one of the two BER samples exceeds the target BER;
determine a second distribution width of the second programming distribution using the third location of the third distribution edge and the fourth location of the fourth distribution edge; and
determine a total distribution level width using the distribution width of the first programming distribution and the second distribution width of the second programming distribution.

5. The memory system of claim 1, wherein the processing device, in response to the request, is further to:
select a second programming distribution for which to locate a third distribution edge, the second programming distribution being adjacent to the first programming distribution;
measure a third BER sample of the second programming distribution using a third offset value that is offset from the first center offset value corresponding to the first read level threshold;
measure a fourth BER sample of the second programming distribution using a fourth offset value that is offset from the third offset value;
determine that the fourth BER sample exceeds the target BER and the third BER sample does not exceed the target BER; and
determine a third location of the third distribution edge at the target BER by interpolating between the third BER sample and the fourth BER sample.

6. The memory system of claim 5, wherein the processing device is to determine a first valley margin between the first programming distribution and the second programming distribution using the first location of the first distribution edge and the third location of the third distribution edge.

7. The memory system of claim 6, wherein the processing device is to:
determine a fourth location of a fourth distribution edge of the second programming distribution by interpolating between two BER samples where one of the two BER samples exceeds the target BER;
determine a fifth location of a fifth distribution edge of a third programming distribution by interpolating between two BER samples where one of the two BER samples exceeds the target BER, the third programming distribution being adjacent to the second programming distribution;
determine a second valley margin between the second programming distribution and the third programming distribution using the fourth location of the fourth distribution edge and the fifth location of the fifth distribution edge; and
determine a read window budget using the first valley margin and the second valley margin.

8. The memory system of claim 1, wherein the processing device, to determine the first location of the first distribution edge, is to:
calculate a first fractional increment location by dividing a first difference between the target BER and the first BER sample by a second difference between the second BER sample and the target BER;
add the first fractional increment location to the first BER sample to obtain a first value;
add the first value to the first center value to obtain a second value; and
multiply the second value by a voltage resolution to obtain the first location of the first distribution edge.

9. The memory system of claim 1, wherein the first read level threshold corresponds to a specified page of a specified page type, wherein the processing device, to measure the first BER sample, is to read the first BER sample for the specified page, wherein the processing device is to compare the first BER sample against the target BER and increment the first offset value to the second offset value in response to the first BER not exceeding the target BER, wherein the processing device, to measure the second BER sample, is to read the second BER sample for the specified page, and wherein the processing device, to determine that the second BER sample exceeds the target BER, is to compare the second BER sample against the target BER.

10. The memory system of claim 9, wherein the processing device, in response to the request and prior to the first BER sample being measured, is further to:
measure a third BER sample of the first programming distribution using a third offset value that is offset from the first center value;
compare the third BER sample against the target BER; and increment the third offset value to the first offset value or to an intervening offset value between the first offset value and the third offset value.

11. A method comprising:
receiving a request to locate one or more distribution edges of one or more programming distributions of a memory cell, the request specifying a target bit error rate (BER) for the one or more programming distributions;
selecting a first programming distribution for which to locate a first distribution edge;
measuring a first BER sample of the first programing distribution using a first offset value that is offset from a first center value corresponding to a first read level threshold;
measuring a second BER sample of the first programming distribution using a second offset value that is offset from the first offset value;
determining that the second BER sample exceeds the target BER and the first BER sample does not exceed the target BER; and
determining a first location of the first distribution edge at the target BER by interpolating between the first BER sample and the second BER sample.

12. The method of claim 11, further comprising:
measuring a third BER sample of the first programing distribution using a third offset value that is offset from a second center offset value of a second read level threshold, the second read level threshold being on an opposite side of the first programming distribution;
measuring a fourth BER sample of the first programming distribution using a fourth offset value that is offset from the third offset value;
determining that the fourth BER sample exceeds the target BER and the third BER sample does not exceed the target BER;
determining a second location of a second distribution edge of the first programming distribution at the target BER by interpolating between the third BER sample and the fourth BER sample; and
determining a distribution width of the first programming distribution using the first location of the first distribution edge and the second location of the second distribution edge.

13. The method of claim 12, further comprising:
determining a third location of a third distribution edge of a second programming distribution by interpolating between two BER samples where one of the two BER samples exceeds the target BER;
determining a fourth location of a fourth distribution edge of the second programming distribution by interpolating between two BER samples where one of the two BER samples exceeds the target BER;
determining a second distribution width of the second programming distribution using the third location of the third distribution edge and the fourth location of the fourth distribution edge; and
determining a total distribution level width using the distribution width of the first programming distribution and the second distribution width of the second programming distribution.

14. The method of claim 11, further comprising:
selecting a second programming distribution for which to locate a third distribution edge, the second programming distribution being adjacent to the first programming distribution;
measuring a third BER sample of the second programing distribution using a third offset value that is offset from the first center offset value corresponding to the first read level threshold;
measuring a fourth BER sample of the second programming distribution using a fourth offset value that is offset from the third offset value;
determining that the fourth BER sample exceeds the target BER and the third BER sample does not exceed the target BER;
determining a third location of the third distribution edge at the target BER by interpolating between the third BER sample and the fourth BER sample; and
determining a first valley margin between the first programming distribution and the second programming distribution using the first location of the first distribution edge and the third location of the third distribution edge.

15. The method of claim 14, further comprising:
determining a fourth location of a fourth distribution edge of the second programming distribution by interpolating between two BER samples where one of the two BER samples exceeds the target BER;
determining a fifth location of a fifth distribution edge of a third programming distribution by interpolating between two BER samples where one of the two BER samples exceeds the target BER, the third programming distribution being adjacent to the second programming distribution;
determining a second valley margin between the second programming distribution and the third programming distribution using the fourth location of the fourth distribution edge and the fifth location of the fifth distribution edge; and
determining a read window budget using the first valley margin and the second valley margin.

16. The method of claim 11, wherein the determining the first location of the first distribution edge comprises:
calculating a first fractional location by dividing a first difference between the target BER and the first BER sample by a second difference between the second BER sample and the target BER;
adding the first fractional location to the first BER sample to obtain a first value;
adding the first value to the first center value to obtain a second value; and
multiplying the second value by a voltage resolution to obtain the first location of the first distribution edge.

17. The method of claim 11, further comprising:
measuring a third BER sample of the first programming distribution using a third offset value that is offset from the first center value prior to the measuring the first BER sample;
comparing the third BER sample against the target BER; and
incrementing the third offset value to the first offset value or to an intervening offset value between the first offset value and the third offset value.

18. The method of claim 11, wherein the measuring the first BER sample comprise reading the first BER sample for a specified page of a specified page type, wherein the determining that the second BER sample exceeds the target BER and the first BER sample does not exceed the target BER comprises:
comparing the first BER sample against the target BER;

incrementing the first offset value to the second offset value in response to the first BER not exceeding the target BER; and comparing the second BER sample against the target BER.

19. A system comprising:

a host system; and a memory sub-system coupled to the host system, wherein the memory sub-system comprises:

one or more memory devices; and a processing device coupled to the one or more memory devices, wherein the processing device is to receive a request from the host system to calculate a read window budget (RWB) of a memory cell, the request specifying a target bit error rate (BER) for a plurality of programming distributions of the memory cell, wherein the processing device, in response to the request, is to:

determine a location for each distribution edge of each of the plurality of programming distributions, wherein to determine the location of a respective distribution edge, the processing device is to:

iteratively measure BER samples of a respective side of a respective programming distribution until a first BER sample exceeds the target BER; and determine the location of the respective distribution edge by interpolating a fractional location between the first BER sample that exceeds the target BER and a second BER sample that does not exceed the target BER;

measure a valley margin of a valley between each pair of the plurality of programming distributions using the locations of respective distribution edges at a respective valley;

calculate the RWB of the memory cell by summing the valley margins between the plurality of programing distributions; and send the RWB to the host system.

20. The system of claim 19, wherein the processing device is further to:

receive a second request from the host system to calculate a total distribution level width of the memory cell, the second request specifying the target BER;

measure a distribution width of each of the plurality of programming distributions using the locations of respective distribution edges of a respective programming distribution;

calculate the total distribution level width of the memory cell by summing distribution widths of the plurality of programing distributions; and send the total distribution level width to the host system.

* * * * *